(12) United States Patent
Hwang et al.

(10) Patent No.: US 9,841,325 B2
(45) Date of Patent: Dec. 12, 2017

(54) HIGH ACCURACY, COMPACT ON-CHIP TEMPERATURE SENSOR

(71) Applicant: Oracle International Corporation, Redwood City, CA (US)

(72) Inventors: Changku Hwang, Santa Clara, CA (US); Ha Pham, San Jose, CA (US); Daisy Jian, San Jose, CA (US); Sebastian Turullols, Los Altos, CA (US)

(73) Assignee: Oracle International Corporation, Redwood Shores, CA (US)

( * ) Notice: Subject to any disclaimer, the term of this patent is extended or adjusted under 35 U.S.C. 154(b) by 481 days.

(21) Appl. No.: 14/524,392

(22) Filed: Oct. 27, 2014

(65) Prior Publication Data

US 2016/0061667 A1    Mar. 3, 2016

Related U.S. Application Data

(60) Provisional application No. 62/043,486, filed on Aug. 29, 2014.

(51) Int. Cl.
*G01K 7/00* (2006.01)
*G01K 7/01* (2006.01)
*G01R 19/10* (2006.01)
*G01R 19/25* (2006.01)

(52) U.S. Cl.
CPC .............. *G01K 7/00* (2013.01); *G01K 7/01* (2013.01); *G01R 19/10* (2013.01); *G01R 19/2506* (2013.01); *G01K 2219/00* (2013.01)

(58) Field of Classification Search
None
See application file for complete search history.

(56) References Cited

U.S. PATENT DOCUMENTS

| 6,046,492 | A  | 4/2000  | Machida  |
| 6,468,825 | B1 | 10/2002 | Machida  |
| 6,489,831 | B1 | 12/2002 | Matranga |
| 7,579,898 | B2 | 8/2009  | Soldera  |

(Continued)

OTHER PUBLICATIONS

Garcia, et al; "Temperature Sensor for the HCS08 Microcontroller Family;" Freescale Semiconductor, Application Note, Document No. AN3031, Rev. 1, Apr. 2010.

(Continued)

*Primary Examiner* — Clayton E Laballe
*Assistant Examiner* — Leon W Rhodes, Jr.
(74) *Attorney, Agent, or Firm* — Meyertons, Hood, Kivlin, Kowert & Goetzel, P.C.

(57) ABSTRACT

Embodiments of a temperature sensing apparatus are disclosed. The apparatus may include a voltage generator and circuitry. The voltage generator may generate a first voltage level and a second voltage level dependent on an operating temperature. In response to a given change in the operating temperature, the first and second voltage levels may change, with the second voltage level changing by a different amount than the first voltage level. The voltage generator may generate a third voltage level. The circuitry may measure the first voltage level, the second voltage level, and the third voltage level, and may calculate the operating temperature dependent on a ratio of a difference between the first voltage level and the second voltage level and the third voltage level.

20 Claims, 5 Drawing Sheets

(56) References Cited

U.S. PATENT DOCUMENTS

| | | | | |
|---|---|---|---|---|
| 7,579,899 | B2 * | 8/2009 | Senriuchi | G01D 3/036 |
| | | | | 327/512 |
| 7,782,119 | B2 * | 8/2010 | Kameyama | G05F 3/227 |
| | | | | 327/513 |
| 8,092,083 | B2 * | 1/2012 | Venkataraman | G01K 7/01 |
| | | | | 257/470 |
| 2006/0093016 | A1 | 5/2006 | McLeod | |
| 2007/0091979 | A1 | 4/2007 | Chiu | |
| 2008/0095213 | A1 | 4/2008 | Lin | |
| 2009/0323758 | A1 | 12/2009 | Im | |
| 2011/0116527 | A1 | 5/2011 | Griffin | |
| 2013/0076381 | A1 * | 3/2013 | Takayanagi | G01K 3/005 |
| | | | | 324/750.03 |
| 2013/0235903 | A1 | 9/2013 | Wong | |
| 2013/0272341 | A1 * | 10/2013 | Lee | G01K 7/34 |
| | | | | 374/184 |
| 2015/0117494 | A1 * | 4/2015 | Caldara | G01K 7/01 |
| | | | | 374/178 |

OTHER PUBLICATIONS

International Search Report and Written Opinion in application No. PCT/US2015/047596 dated Nov. 12, 2015.

\* cited by examiner

HIGH ACCURACY, COMPACT ON-CHIP TEMPERATURE SENSOR

PRIORITY INFORMATION

This application claims priority to U.S. provisional patent application Ser. No. 62/043,486, entitled "HIGH ACCURACY, COMPACT ON-CHIP TEMPERATURE SENSOR", filed Aug. 29, 2014.

BACKGROUND

Field of the Invention

The embodiments herein relate to processors and, more particularly, to implementation of on-chip temperature sensors.

Description of the Related Art

The performance of high-end microprocessor chips has increased over the years and continues to increase when looking at chip designs for the future. Generally speaking, the performance boost of microprocessors may be associated with higher clock frequencies (i.e., shorter clock periods) allowing more instructions to be executed in a given period of time and smaller manufacturing technologies that allow more complex circuits to be designed into a given area of a chip (i.e., higher density circuits), allowing for more functionality. These increases in processor frequency and circuit density, however, may include increases in power consumption and thus, may increase chip temperature and temperature variations inside the chip.

A microprocessor operating at a high temperature with temperature variations across the chip may experience various issues, such as, for example, performance degradation, leakage power increase, reduced reliability, function failures, etc. Thermal considerations, therefore, may need to be properly addressed during microprocessor chip design. One method to obtain temperature information may be to place thermal diodes at several locations on the chip. This method, however, might require many external pins dedicated to operating the diodes, and may also require external companion chips to read temperature information generated by each thermal diode.

SUMMARY

Various embodiments of systems and methods for a temperature sensing apparatus are disclosed. The apparatus may include a voltage generator and circuitry. The voltage generator may be configured to generate a first voltage level and a second voltage level dependent on an operating temperature. In response to a given change in the operating temperature, the first and second voltage levels may change by first and second amounts, respectively, wherein the second amount may be different than the first amount. The voltage generator may be configured to generate a third voltage level, wherein the third voltage level may change by a third amount in response to the given change in the operating temperature, and wherein the third amount is less than the first amount and the second amount. The circuitry may be configured to measure the first voltage level, the second voltage level, and the third voltage level, and may be configured to calculate the operating temperature dependent on a ratio of a difference between the first voltage level and the second voltage level and the third voltage level.

In a further embodiment, to measure the first voltage level, the second voltage level, and the third voltage level, the circuitry may be configured to measure a time for a capacitor to charge to each of the first voltage level, the second voltage level, and the third voltage level, respectively. In another embodiment, to measure the first voltage level, the second voltage level, and the third voltage level, the circuitry may be further configured to select, one at a time, each of the first voltage level, the second voltage level, and the third voltage level and measure the selected voltage level.

In one embodiment, the voltage generator may be further configured to change the first voltage level linearly with corresponding changes in the operating temperature. The voltage generator may also be configured to change the second voltage level linearly with corresponding changes in the operating temperature.

In another embodiment, the circuitry may be further configured to calibrate the voltage generator at a single temperature. The circuitry may also be configured to determine calibration values in response to calibrating the voltage generator.

In a further embodiment, the first amount and the second amount may change responsive to variations in a manufacturing process, and the circuitry may be further configured to compensate for the change in the first amount and second amount by using the calibration values. In another embodiment, the circuitry may be further configured to send the calculated operating temperature to a power management unit.

BRIEF DESCRIPTION OF THE DRAWINGS

The following detailed description makes reference to the accompanying drawings, which are now briefly described.

Figure 1:
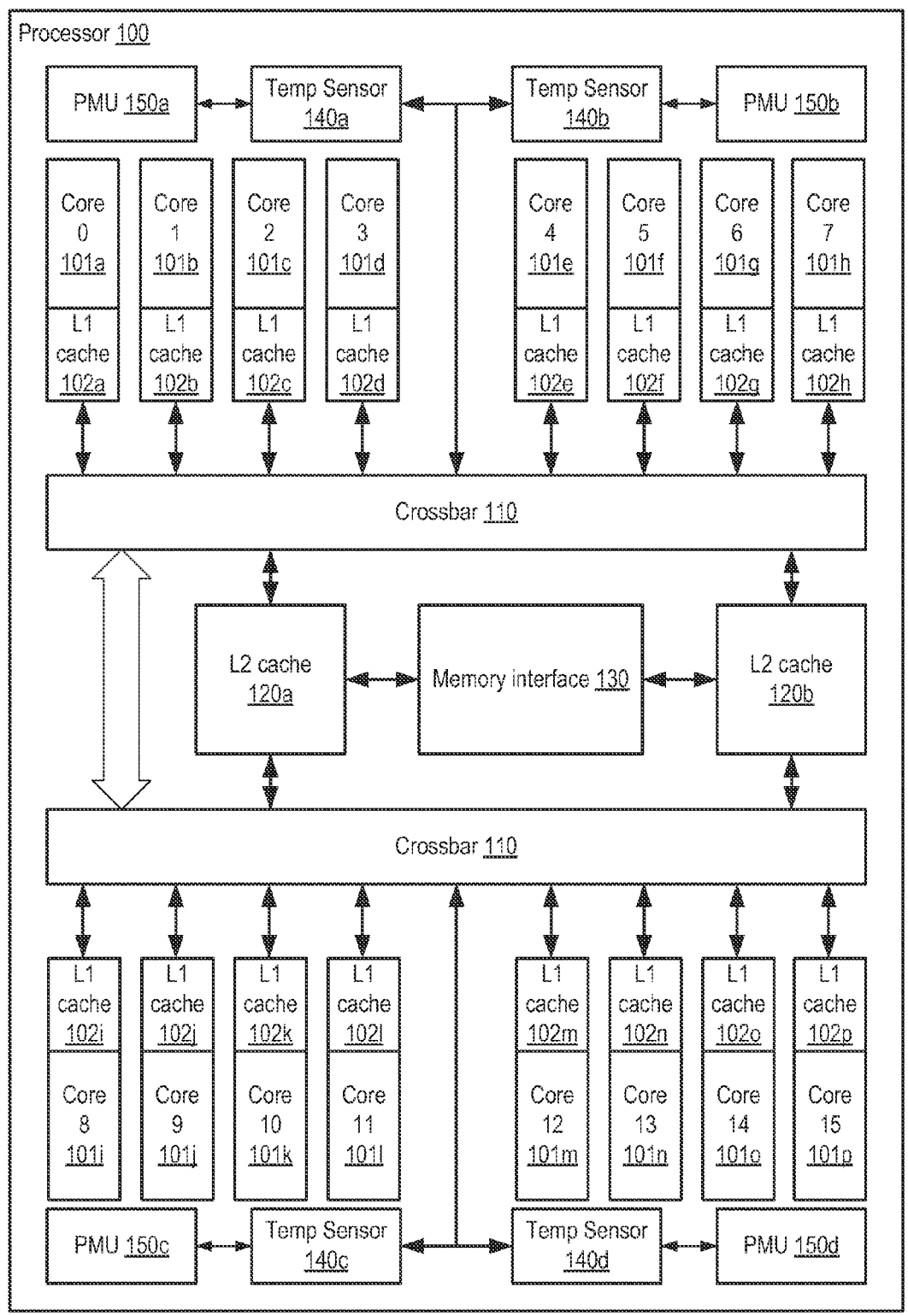
FIG. 1 is a block diagram illustrating an embodiment of a microprocessor.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

DETAILED DESCRIPTION OF EMBODIMENTS

Introduction

Generally speaking, a microprocessor (also referred to as a "processor," a "microprocessing unit," or "MPU") may include one or more processor cores. A processor core (or simply, a "core") may refer to a unit of a microprocessor that is capable of executing program instructions and processing data independently of other processor cores within the microprocessor, such that multiple cores may execute instructions concurrently. Performance of a processing core may be impacted by a multitude of factors, including microprocessor clock speed, the number of cores in the microprocessor, and speed of the memory accesses.

Another factor that may impact performance is a temperature of the microprocessor chip itself. Operating at higher clock frequencies and/or higher supply voltages, the temperature of the microprocessor chip may increase, especially in high density designs that may be used in modern chips. The temperature of the chip, also referred to herein as a junction temperature, may increase beyond the ambient temperature surrounding the packaged chip. External components, such as heat sinks and fans, may be used in some embodiments to improve heat dissipation of a packaged microprocessor, thereby cooling the chip off faster and allowing the microprocessor to run at a higher performance level for a longer time. Even with these external components, a microprocessor may still generate more heat than can be dissipated in a given amount of time.

In a multi-core microprocessor, in which two, four, or even 32 or more processor cores may be included, the various cores may be operating at different performance levels, which may lead to variations of temperature across a microprocessor chip. In some cases, a portion of the cores may be operating at a higher performance level and therefore generating more heat than the remaining portion of the cores. These temperature variations across the chip may cause various issues, such as, for example, performance degradation, leakage power increase, reduced reliability, function failures, etc. To address the temperature variations, temperature sensing may be required at multiple locations throughout the microprocessor chip in order to adjust performance levels to compensate for high operating temperatures. To minimize die size increases and chip pin count increases, a temperature sensing circuit with a compact design and requiring no external pins may be desired. Moreover, the accuracy of such a temperature sensing circuit may require an accuracy level adequate for making such adjustments before a failure occurs without unnecessarily limiting the performance capabilities of the microprocessor.

Embodiments disclosed herein may provide accurate, on-chip temperature sensing in a compact circuit design with fewer external pins required. These embodiments may measure junction temperatures and convert the measured temperatures to digital control signals which may be sent to one or more on-chip power management units to adjust frequencies and/or voltages of cores operating in the microprocessor. Some embodiments may include a calibration capability to compensate for process and power supply variations, which may produce more accurate temperature sensing during microprocessor operation.

Multicore Processor Overview

In various embodiments, a multicore processor may include a number of instances of a processing core, as well as other features. One example of a 16-core processor is depicted in FIG. 1. In the illustrated embodiment, processor 100 may include sixteen instances of a core, denoted as cores 101$a$-$p$ and also designated "core 0" though "core 15." Cores 101$a$-$p$ may each include local L1 cache 102$a$-$p$. Cores 101$a$-$p$ may be coupled to L2 caches 120$a$ and 120$b$ through crossbar 110. In addition, cores 101$a$-$p$ may be coupled to memory interface 130 through L2 caches 120$a$-$b$. Memory interface 130 may be further coupled to L3 cache 140 as well as system memory 150. It is noted that in various embodiments, the organization of FIG. 1 may represent a logical organization rather than a physical organization, and other components may also be employed. For example, in some embodiments, cores 101$a$-$p$ and L2 caches 120$a$-$b$ may not connect directly to crossbar 410, but may instead interface with the crossbar through intermediate logic. L3 cache 140 and system memory may reside external to processor 100.

Cores 101$a$-$p$ may be configured to execute instructions and to process data according to a particular Instruction Set Architecture (ISA). In one embodiment, cores 101$a$-$p$ may be configured to implement the SPARC® V9 ISA, although in other embodiments it is contemplated that any desired ISA may be employed, such as x86, ARM®, PowerPC® or MIPS®, for example. Additionally, as described in greater detail below, in some embodiments each instance of core 101 may be configured to execute multiple threads concurrently, where each thread may include a set of instructions that may execute independently of instructions from another thread. In various embodiments it is contemplated that any suitable number of cores 101$a$-$p$ may be included within a processor, and that cores 101$a$-$p$ may concurrently process some number of threads.

L1 caches 102$a$-$p$ may reside within cores 101$a$-$p$ or may reside between cores 101$a$-$p$ and crossbar 110. L1 caches 102$a$-$p$ may be configured to cache instructions and data for use by their respective cores 101$a$-$p$. In some embodiments, each individual cache 102$a$-$p$ may be implemented using set-associative or direct-mapped techniques. For example, in one embodiment, L1 caches 102$a$-$p$ may be 13 kilobyte (KB) caches, where each L1 cache 102$a$-$p$ is 2-way set associative with a 13-byte line size, although other cache sizes and geometries are possible and contemplated.

Crossbar 110 may be configured to manage data flow between cores 101$a$-$p$ and the shared L2 caches 120$a$-$b$. In one embodiment, crossbar 110 may include logic (such as multiplexers or a switch fabric, for example) that allows any core 101$a$-$p$ to access any bank of L2 cache 120$a$-$b$, and that conversely allows data to be returned from any bank of L2 cache 120$a$-$b$ to any core 101$a$-$p$. Crossbar 110 may be configured to concurrently process data requests from cores 101$a$-$p$ to L2 cache 120$a$-$b$ as well as data responses from L2 cache 120$a$-$b$ to cores 101$a$-$p$. In some embodiments, crossbar 110 may include logic to queue data requests and/or responses, such that requests and responses may not block other activity while waiting for service. It is noted that in various embodiments, crossbars 110 may be implemented using any suitable type of interconnect network, which, in some embodiments, may correspond to a physical crossbar interconnect.

L2 caches 120a-b may be configured to cache instructions and data for use by cores 101a-p. L2 cache 120a may be coupled to cores 101a-h and L2 cache 120b may similarly be coupled to cores 101i-p. As the number of cores 101 is increased, the size and/or number of L2 caches 120 may also be increased in order to accommodate the additional cores 101. For example, in an embodiment including 16 cores, L2 cache 120 may be configured as 2 caches of 3 MB each, with each cache including 8 individual cache banks of 384 KB, where each bank may be 24-way set associative with 256 sets and a 13-byte line size, although any other suitable cache size or geometry may also be employed.

Memory interface 130 may be configured to manage the transfer of data between L2 caches 120a-b or external system memory in response to L2 fill requests and data evictions, for example. In some embodiments, multiple instances of memory interface 130 may be implemented, with each instance configured to control a respective bank of external system memory. Memory interface 130 may be configured to interface to any suitable type of memory, such as Fully Buffered Dual Inline Memory Module (FB-DIMM), Double Data Rate or Double Data Rate 2 Synchronous Dynamic Random Access Memory (DDR/DDR2 SDRAM), or Rambus® DRAM (RDRAM®), for example. In some embodiments, memory interface 130 may be configured to support interfacing to multiple different types of memory.

Cores 101a-p may be organized into groups, with the cores of each group physically co-located to share resources such as locally distributed power supply signals and clock signals. In the illustrated embodiment, cores 101a-p may be segmented into groups of four such that each group of cores may occupy roughly one quadrant of a microprocessor chip. Each quadrant may include one or more temperature sensing units 140a-d. Temperature sensing units 104a-d may monitor a junction temperature in their respective quadrant. Monitoring may be continuous, periodic, or in response to a control signal asserted by a given core of cores 101a-p. Details of embodiments of temperature sensing units will be provided below.

In addition to temperature sensing units 140a-d, a given one of power management units (PMU) 150a-d may be located in each quadrant. Power control circuits 150a-d may control local distribution of power supply signals and clock signals within each quadrant. Power control circuits 150a-d may control voltage levels of one or more power supply signals and may control frequencies of one or more clock signals to the cores 101 in a respective quadrant. Voltage levels may be adjusted by use of voltage regulating circuits or by selecting from multiple power supply signals through switches or multiplexors. Similarly, clock signal frequencies may be adjusted through use of local clock divider circuits or by selecting from multiple clock signals through switches or multiplexors. In some embodiments, power control circuits may receive commands to adjust voltage levels or clock frequencies from other components in processor 100, such as from one of cores 101a-p or from a corresponding temperature sensing unit 140a-d. In other embodiments, power control circuits 150a-d may receive a temperature value from a corresponding temperature sensing unit 140a-d and determine if adjustments are necessary.

It is noted that FIG. 1 is merely an example of a multicore processor. In other embodiments, processor 100 may include network and/or peripheral interfaces. The physical structure may not be represented by FIG. 1 as many other physical arrangements may be possible and are contemplated.

Figure 2:
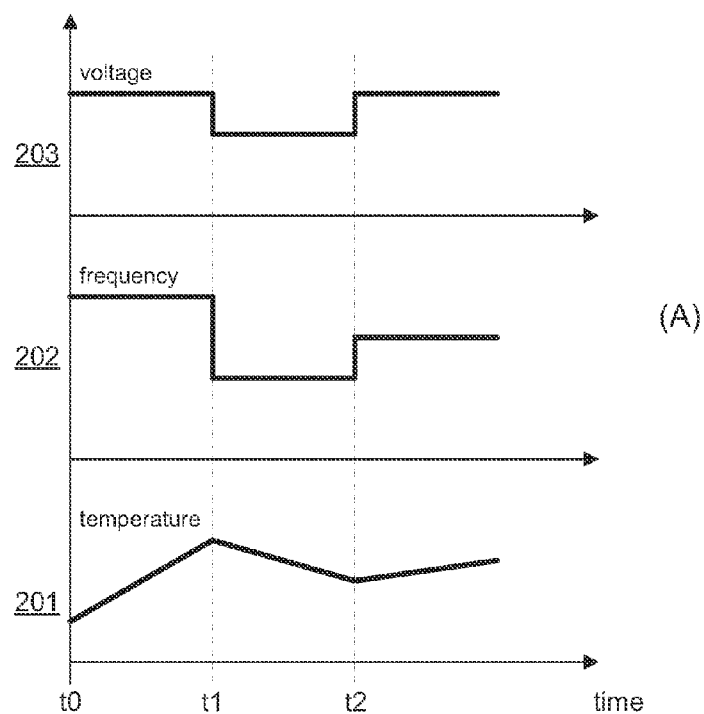
FIG. 2A is a chart illustrating a possible relationship between temperature, operating frequency and operating voltage in an embodiment of a microprocessor.
FIG. 2B is a chart illustrating a possible relationship between temperature and various voltage levels in an embodiment of a temperature sensing unit.
Figure 2:
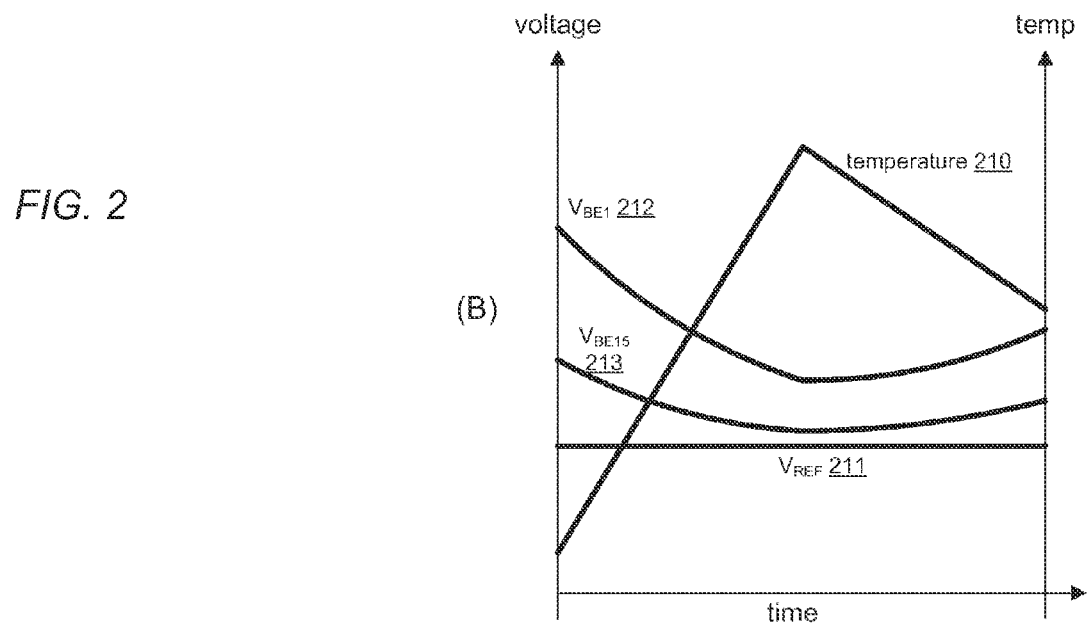

Turning to FIG. 2, two charts are illustrated. FIG. 2A shows a chart illustrating a possible relationship between junction temperature, supply voltage, and operating frequency in an embodiment of a microprocessor, such as, for example, processor 100 in FIG. 1. Waveform 201 shows an example junction temperature profile over time for various combinations of supply voltage and operating frequency. Waveform 202 shows an operating frequency profile over time that might be utilized by processor 100. Waveform 203 may correspond to a profile over time of a voltage level of a power supply in processor 100.

At time t0, junction temperature 201 may be at a low point, for example after a power on of a system including processor 100. Operational frequency 202 may be set at a high frequency for maximum performance and supply voltage 203 may also be set to a high level to support the high frequency. From time t0 to time t1, junction temperature 201 may rise responsive to the high frequency and high voltage level. At time t1, junction temperature 201 may reach a first threshold level, which may correspond to a maximum safe operating temperature. In response to reaching the first threshold level, operating frequency 202 and voltage level 203 may be reduced to lower power consumption.

With the reduced power consumption, less heat may be produced and a packaged device including processor 100 may be able to dissipate more heat than is generated, which may result in junction temperature 201 falling between times t1 and t2. At time t2, junction temperature 201 may reach a second threshold level, which may correspond to a temperature far enough below the maximum safe operating temperature to allow for a return to higher performance settings. Any combination of a number of criteria may be used to determine a setting for the second threshold temperature. In response to reaching the second threshold level, voltage level 203 may be raised back to the previous level of t0 while operational frequency 202 may be raised, but may be set to a frequency lower than the setting at time to. After time t2, junction temperature 201 may begin to rise again, perhaps at a lower rate than between times t0 and t1.

The chart of FIG. 2A highlights how monitoring junction temperature of a microprocessor might be useful for keeping the microprocessor within a safe operating range. It is noted that the waveforms of FIG. 2A are merely examples and are simplified to demonstrate the disclosed concepts. Actual waveforms may vary due to various influences such operating conditions, manufacturing technology used and processing variations during fabrication. For example, in some embodiments, junction temperature 201 may continue to fall, at a slower rate, after time t2 rather than rise.

Moving to FIG. 2B, another chart illustrating relationships between temperature and various voltage levels in an embodiment of a temperature sensing unit, such as, for example, one of temperature sensing units 140a-d. Four waveforms are illustrated in the chart. Temperature 210 may correspond to a junction temperature of a chip. $V_{REF}$ 211 may correspond to a reference voltage level on the chip. A voltage level of a first temperature sensitive circuit may correspond to $V_{BE1}$ 212. A voltage level of a second temperature sensitive circuit may correspond to $V_{BE15}$ 213.

In the example of FIG. 2B, $V_{REF}$ 211 is shown to be invariable with respect to the changes in temperature 210. In other words, $V_{REF}$ 211 may be constant versus changes in the junction temperature of the chip. $V_{REF}$ 211 may also, in some embodiments, be constant versus changes in a voltage level of a power supply coupled to the chip (although the power supply may be required to be above a minimum voltage for this to be true). In other embodiments, $V_{REF}$ 211 may change proportionately to changes in the voltage level of the power supply. Any suitable circuit design may be used to generate $V_{REF}$ 211, such as, for example, a bandgap voltage reference or an output of a voltage regulator.

In contrast to $V_{REF}$ 211, $V_{BE1}$ 212 is shown to change inversely proportionate with respect to changes in temperature 210. As temperature 210 rises, $V_{BE1}$ 212 falls and as temperature 210 falls, $V_{BE1}$ 212 rises. $V_{BE15}$ 213 may similarly fall and rise in response to respective rising and falling of temperature 210. $V_{BE15}$ 213, however, may have a different rate of change, i.e., temperature slope, compared to $V_{BE1}$ 212. In other words, $V_{BE15}$ 213 may fall slower than $V_{BE1}$ 212 in response to rising temperature 210 and may rise slower than $V_{BE1}$ 212 in response to temperature 210 falling. In some embodiments, $V_{BE1}$ 212 and $V_{BE15}$ 213 may not change linearly with respect to changes in temperature, but a delta between $V_{BE1}$ 212 and $V_{BE15}$ 213 may remain linear with respect to temperature changes. Both $V_{BE15}$ 213 and $V_{BE1}$ 212 may, in some embodiments, be sensitive to changes in a voltage level of a power supply coupled to the chip. The waveforms in FIG. 2B, therefore may be assumed to occur at a given operational voltage level. In such embodiments, both $V_{BE15}$ 213 and $V_{BE1}$ 212 may scale proportionately with the changes in the voltage level.

The voltage supplies for generating $V_{BE15}$ 213 and $V_{BE1}$ 212 may be implemented with similar circuits, utilizing any suitable circuit design. For example, the voltage supply designs may, in some embodiments, include diodes created with respective bipolar junction transistors (BJTs). To create the different temperature slopes for each diode, the diode used to generate $V_{BE1}$ 212 may be designed to have a current density that is a known multiple of the diode used to generate $V_{BE15}$ 213. For example, the $V_{BE1}$ 212 diode may have a current density that is 15 times greater than the current density of the $V_{BE15}$ 213 diode.

The chart of FIG. 2B illustrates that by understanding the relationship of the included voltage levels may enable a method for measuring a junction temperature of a microprocessor. It is noted that the waveforms of FIG. 2B are simplified examples for demonstrating the disclosed concepts. For example, although $V_{REF}$ 211 is shown to be lower than both $V_{BE15}$ 213 and $V_{BE1}$ 212, in some embodiments, at certain temperatures, $V_{REF}$ 211 may be higher than $V_{BE1}$ 212 or $V_{BE15}$ 213. As with FIG. 2A, actual waveforms may vary due to various influences such operating conditions, manufacturing technology used and processing variations during fabrication.

Figure 3:
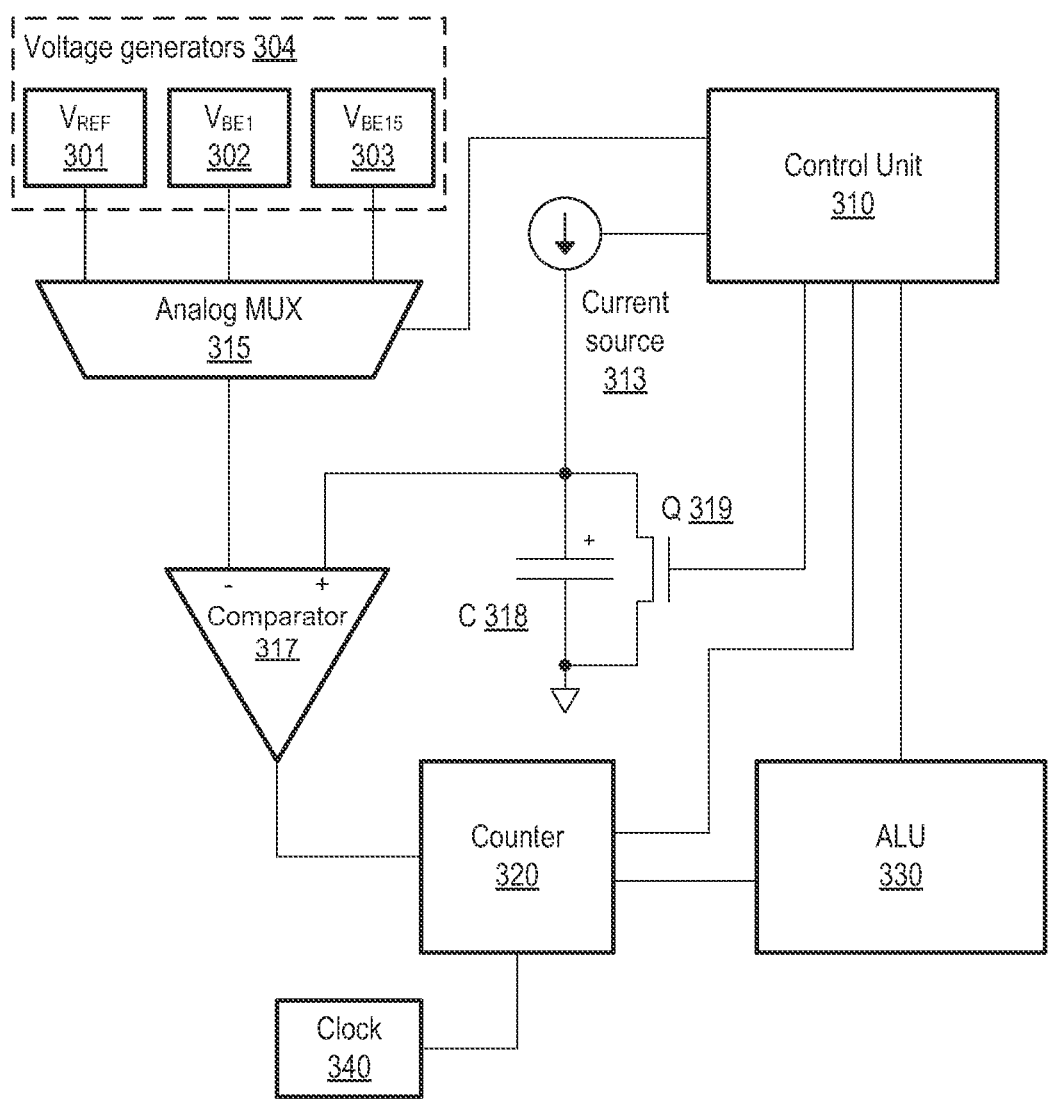
FIG. 3 is a block diagram illustrating an embodiment of a temperature sensing unit.

Turning now to FIG. 3, a block diagram illustrating an embodiment of a temperature sensing unit is presented. Temperature sensing unit 300 may correspond to one instance of temperature sensing units 140a-d. Temperature sensing unit 300 may include three voltage generators 304: $V_{REF}$ 301, $V_{BE1}$ 302 and $V_{BE15}$ 303, all coupled to inputs of analog multiplexing unit (analog MUX) 315. Temperature sensing unit 300 may also include control unit 310, coupled to analog MUX 315, current source 313, counter 320, arithmetic logic unit (ALU) 330, and transistor Q 319. Comparator 317 may also be included in temperature sensing unit 300, coupled to an output of analog MUX 315 and capacitor 318. Clock source 340 may be coupled to counter 320.

$V_{REF}$ 301 may be a voltage generator providing an output corresponding to the waveform of $V_{REF}$ 211 in FIG. 2B. $V_{REF}$ 301 may be a bandgap voltage reference, or any other suitable circuit, and may have a smaller temperature slope (amount of voltage level change per degree Celsius of temperature change) than $V_{BE1}$ 302 or $V_{BE15}$ 303. In some embodiments, $V_{REF}$ 301 may have little to no voltage level change in response to temperature changes. Due to its stability over temperature, $V_{REF}$ 301 may be used in temperature sensing unit 300 as a reference point for $V_{BE1}$ 302 and $V_{BE15}$ 303.

$V_{BE1}$ 302 and $V_{BE15}$ 303 may be a pair of voltage generators providing outputs corresponding to $V_{BE1}$ 212 and $V_{BE15}$ 213 in FIG. 2B. $V_{BE1}$ 212 and $V_{BE15}$ 213 may be any suitable voltage generating circuits with predictable temperature slopes. $V_{BE1}$ 212 may be designed to have a higher temperature slope than $V_{BE15}$ 213. For example, both $V_{BE1}$ 212 and $V_{BE15}$ 213 may include temperature sensitive diodes designed such that a current density of $V_{BE1}$ 212 is 15 times higher than the current density of $V_{BE15}$ 213. In other embodiments, factors other than 15 may be used.

Outputs of $V_{REF}$ 301, $V_{BE1}$ 302 and $V_{BE15}$ 303 may all be coupled to inputs of analog MUX 315. Control unit 310 may be coupled to the selection input of analog MUX 315 and may control analog MUX 315 to select a given one of the three voltage generators 304. The output of analog MUX 315 may be coupled to one input of comparator 317. Comparator 317 may output a digital signal with a value depending on which of two analog input signals has a higher voltage level.

Control unit 310 may also be coupled to current source 313 to enable or disable an output of current source 313. Current source 313 may output a constant current when enabled, regardless of a voltage level present on the output. The output of current source 313 may be coupled to C 318, Q 319, and a second input to comparator 317. When enabled by control unit 310, current source 313 may charge C 318 while Q 319 is turned off. The constant current output of current source 313 may cause a repeatable voltage ramp to rise on the second input of comparator 317. When the voltage level on the second input of comparator 317 is equal to or greater than the voltage level from the selected voltage generator 304 on the other input to comparator 317, then the output of comparator 317 may transition. The output of comparator 317 may be coupled to an input of counter 320, such that this transition disables further increments of counter 320.

Control 310 may turn Q 319 on and turn current source 313 off after the voltage level of the voltage ramp has reached the voltage level of the selected voltage generator. Turning current source 313 off and Q 319 on may allow Q 319 to discharge the voltage level on C 318 to approximately zero volts, i.e., discharge C 18.

Control unit 310 may also enable, disable, and reset counter 320. For example, control 310 may reset counter 320 while current source 313 is disabled and then enable counter 320 at a similar time when current source 313 is turned on. When enabled, counter 320 may increment a count value responsive to a rising or falling transition on a clock signal received from clock source 340. By enabling both current source 313 and counter 320 at approximately the same time, counter 320 may increment while the voltage ramp on C 318 is less than the selected voltage generator 304 and then stop incrementing responsive to the transition of comparator 317 when the voltage ramp reaches the selected voltage generator 304. The value of counter 320 may correspond to a time for the level of the voltage ramp to reach the voltage level of the selected voltage generator 304. Assuming the voltage ramp maintains a consistent slew rate and clock source 340 remains consistent, count values may be determined for each of $V_{REF}$ 301, $V_{BE1}$ 302 and $V_{BE15}$ 303 that correspond to the relative voltage levels of each of the three voltage generators 304. Counter 320 may send each count value to ALU 330, which may, responsive to a signal from control unit 310, calculate a temperature value corresponding to the temperature at the locations of the voltage generators 304. ALU 330 may utilize the count values for each of the three voltage generator 304 to determine the temperature value.

To determine a temperature value, ALU 330 may be designed to calculate a result for an equation expressing the relationship between the voltage levels of the three voltage generators 304 and a temperature of voltage generators 304. To determine the equation, a first step may require determining equations for each of voltage generators 304. Voltage generators 304 may be designed such that an equation for the voltage level of each output may be expressed as an equation for a voltage level of a diode. An equation for determining current of a diode dependent on voltage and temperature is given in equation 1.

$$I = I_o \left( e^{\frac{qV_{BE}}{KTemp\eta}} - 1 \right) \approx I_o e^{\frac{qV_{BE}}{KTemp\eta}} \tag{1}$$

$I_o$ is a reverse bias current of the diode, and $q/\eta$ is a measure of charge density, K is Boltzmann's constant, and Temp is the temperature in Kelvin. $V_{BE}$ is the voltage across the diode and may correspond to the voltage level of each output of voltage generators 304. It is noted that equation 1 may be valid when $V_{BE} \geq 200$ mV. In some embodiments, $V_{BE}$ may be measured on two diodes with different current densities. In some embodiments, $V_{BE1}$ 302 and $V_{BE15}$ 303 may be designed such that $V_{BE1}$ 302 produces a current approximately fifteen times greater than a current of $V_{BE15}$ 303. In such embodiments, equation 1 may be used to generate equation 2.

$$I_{BE1} = 15 I_{BE15} = 15 I_o e^{\frac{qV_{BE15}}{KTemp\eta}} = I_o e^{\frac{qV_{BE1}}{KTemp\eta}} \tag{2}$$

Equation 2 may be solved for $V_{BE15}$ in equation 3 and for $V_{BE1}$ in equation 4. Then, equations 3 and 4 may be combined in equation 5 by subtracting $V_{BE15}$ from both sides of equation 4.

$$V_{BE15} = \frac{kTemp\eta}{q} \ln \frac{I_{BE1}}{15 I_o} = \frac{kTtemp\eta}{15 I_o} = \frac{kTemp\eta}{q} \ln \frac{I_{BE1}}{I_o} - \frac{kTemp\eta}{q} \ln 15 \tag{3}$$

$$V_{BE1} = \frac{kTemp\eta}{q} \ln \frac{I_{BE1}}{I_o} \tag{4}$$

$$V_{BE1} - V_{BE15} = \frac{kTemp\eta}{q} \ln 15 \tag{5}$$

To calculate the temperature, Temp, the voltage levels of $V_{BE1}$ 302 and $V_{BE15}$ 303 are measured as described above, as well as the voltage levels of $V_{REF}$ 301. Equations for $V_{BE1}$ 302, $V_{BE15}$ 303, and $V_{REF}$ 301 relative to a capacitance value of C 318 and a time, t, are provided in equations 6, 7, and 8. Each time, t, may correspond to a time to charge C 318 to the respective voltage levels of each voltage generator 304.

$$V_{BE1} = \frac{I}{C} t_1 \tag{6}$$

$$V_{BE15} = \frac{I}{C} t_{15} \tag{7}$$

$$V_{ref} = \frac{I}{C} t_{ref} \tag{8}$$

Equations 6 and 7 may be combined, by subtracting equation 7 from equation 6 to create equation 9. The term $(V_{BE1} - V_{BE15})$ may be substituted by equation 5 to produce equation 10.

$$V_{BE1} - V_{BE15} = \frac{I}{C} (t_1 - t_{15}) \tag{9}$$

$$(t_1 - t_{15}) = \frac{C}{I} \frac{K\eta}{q} \ln 15 * Temp \tag{10}$$

To remove the dependence on capacitance value, C, from equation 10, equation 8 may be solved for C and substituted into equation 11. Equation 11 may then be solved for Temp to produce equation 12.

$$\frac{t_1 - t_{15}}{t_{ref}} = \frac{K\eta}{q V_{ref}} \ln 15 * Temp \tag{11}$$

$$Temp = \frac{q V_{ref}}{K\eta \ln 15} \frac{t_1 - t_{15}}{t_{ref}} = \frac{q V_{ref}}{K\eta \ln 15} \frac{N_1 - N_{15}}{N_{ref}} \tag{12}$$

In equation 12, the times, t, may be substituted by N, where N may correspond to the respective count value from counter 320. Since an N term appears in both the numerator and denominator, the units of N cancel, indicating that the absolute time is not relative to determining temperature as long as clock 340 is consistent for the three count values used to measure the three outputs of voltage generators 304. Thus, the temperature may be determined using a constant value, $qV_{REF}/K\eta \ln 15$, (which may be calibrated per part) multiplied by $(N_1 - N_{15})/N_{ref}$. In equation 12, Temp is still in degrees Kelvin.

During a single calibration procedure, the constant may be calculated at a known temperature $T_c$ ($T_c$ is now in Celsius) using equation 13 (derived from equation 12), and generating calibration count values ($N_{refc}$, $N_{1c}$, and $N_{15c}$) from counter 320 for the three voltage generators 304 at $T_c$.

$$\frac{q V_{ref}}{K\eta \ln 15} = \frac{(T_c + 273) N_{refc}}{N_{1c} - N_{15c}} \tag{13}$$

A temperature value may now be determined by equation 14 (T is now in Celsius).

$$T = (T_c + 273) \frac{N_{refc}}{N_{1c} - N_{15c}} \frac{N_1 - N_{15}}{N_{ref}} - 273 \tag{14}$$

Using equation 14, a junction temperature measurement may be calculated independent of process variations of voltage generator 304 or capacitor C 318. Accuracy of the junction temperature measurement may be determined by the accuracy of the temperature measurement during the single calibration procedure and the stability of clock 340 while three count values are generated for a given temperature measurement. In other words, the single calibration procedure may compensate for any process variations during manufacturing. In addition, since the constant is dependent on $V_{REF}$, the single calibration procedure may also help to compensate for changes supply voltage changes.

It is noted that FIG. 3 is merely an example of a temperature sensing unit. In other embodiments, temperature sensing unit 300 may include other components or components may be coupled differently. The physical structure may not be represented by FIG. 3 as many other physical arrangements may be possible and are contemplated.

Figure 4:
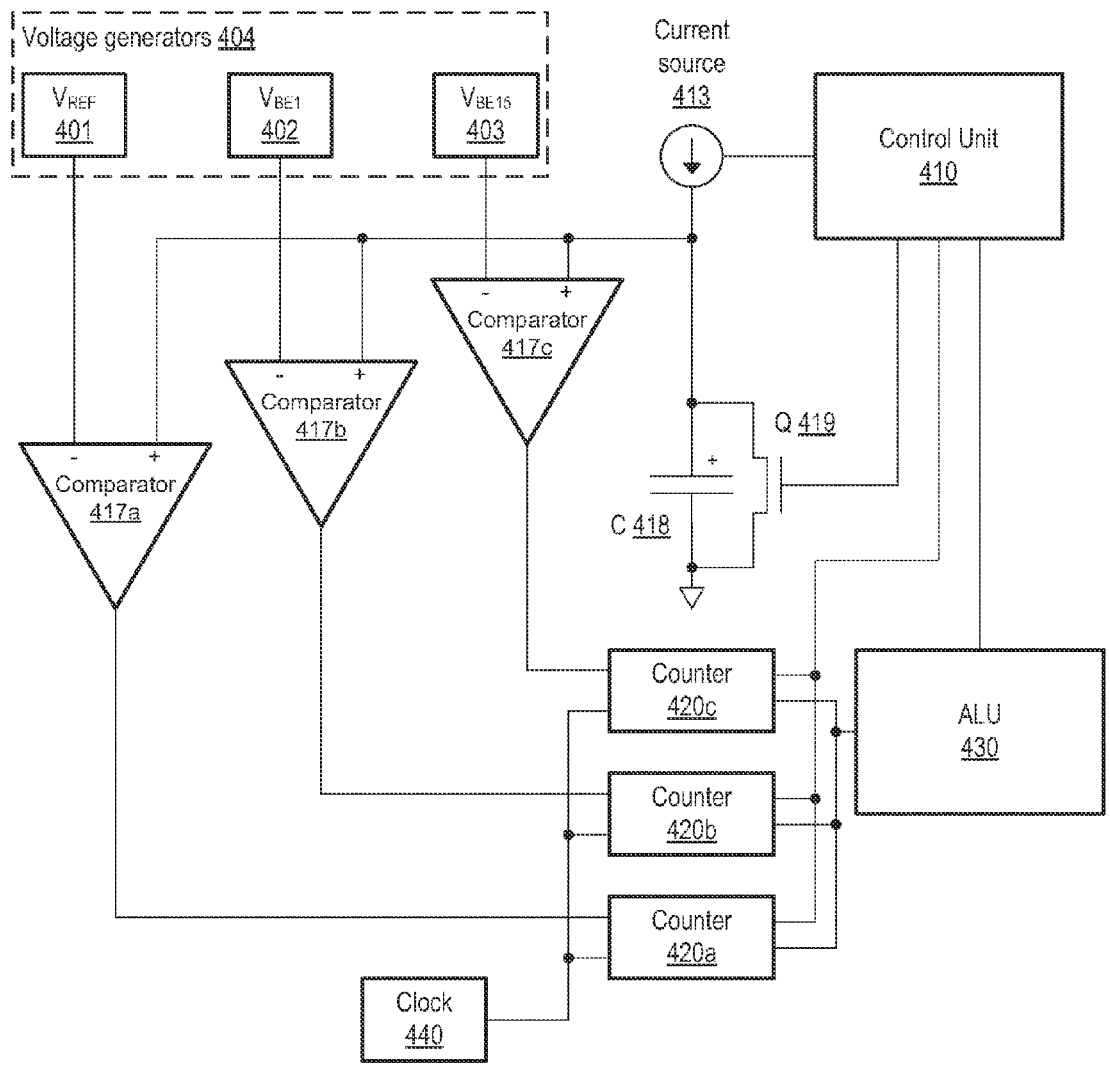
FIG. 4 is a block diagram illustrating another embodiment of a temperature sensing unit.

Moving now to FIG. 4, another embodiment of a temperature sensing unit is illustrated. Temperature sensing unit 400 may be an alternative embodiment for another embodiment of a temperature sensing units 140a-d in FIG. 1. In some embodiments of processor 100, temperature sensing units 140a-d may correspond to a combination of temperature sensing unit 300 and temperature sensing unit 400. Components of temperature sensing unit 400 may correspond to similar components of temperature sensing unit 300, and therefore their descriptions in regards to FIG. 3 may also apply to the embodiment of FIG. 4, except as noted below.

In contrast to temperature sensing unit 300, temperature sensing unit 400 may not include an analog multiplexing unit, such as analog MUX 315, and may instead include two additional comparators each coupled to a respective additional counter. Outputs of $V_{REF}$ 401, $V_{BE1}$ 402 and $V_{BE15}$ 403 may be coupled to inputs of comparators 417a, 417b, and 417c, respectively. Outputs of comparators 417a-c may be coupled to counters 420a-c, respectively, such that when a voltage level of a voltage ramp on C 418 rises above a voltage level of a respective output of voltage generators 404, the respective counter 420a-c may cease to increment its count value. Each counter 420a-c may send its respective count value to ALU 430 to be used in a junction temperature calculation. ALU 430 may determine a junction temperature as described for ALU 330 in FIG. 3.

By including a respective comparator 417 and respective counter 420 for each voltage generator 404, temperature sensing unit 400 may be capable of measuring a voltage level of each voltage generator 404 in parallel. Measuring each voltage level in parallel may decrease a time for determining a junction temperature versus measuring each voltage level in series. As used herein, "parallel" is not intended to imply an exact overlap, but rather to indicate that at least a portion of each measurement may occur while at least a portion of the other measurements is active. The addition of two comparators and two counters may, however, increase a die size of temperature sensing unit 400 in comparison to a die size of temperature sensing unit 300.

It is noted that FIG. 4 is merely another example of a temperature sensing unit. In other embodiments, components of temperature sensing unit 400 may be coupled differently and other components may be included or excluded. The physical structure may not be represented by FIG. 4 as many other physical arrangements may be possible and are contemplated.

Method for Detecting Temperature

Figure 5:
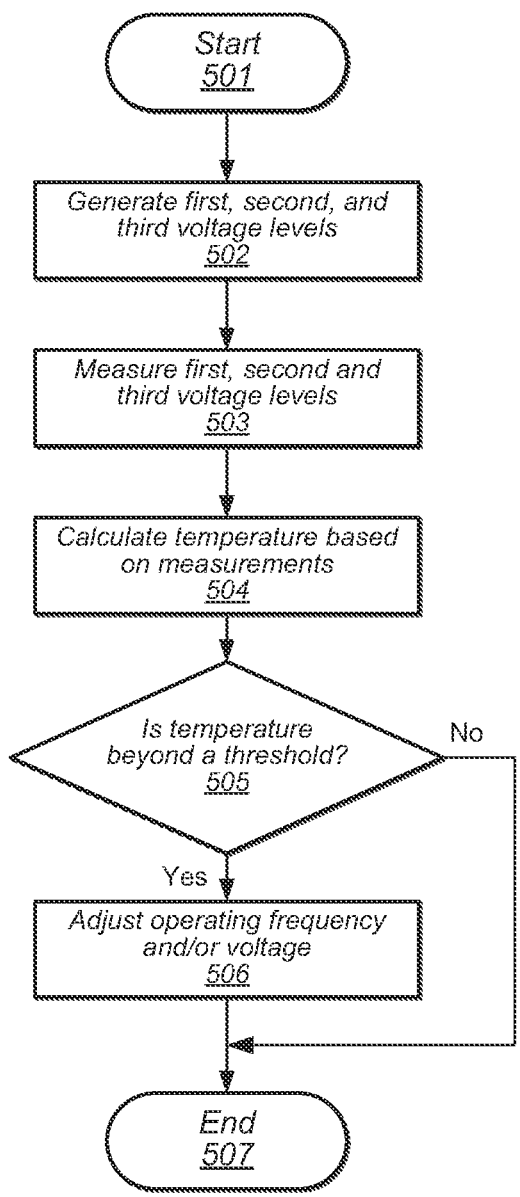
FIG. 5 illustrates a flow chart depicting an embodiment of a method for operating a temperature sensing unit.

Turning now to FIG. 5, a method is illustrated for operating a temperature sensing unit to determine a junction temperature and adjusting a performance of a processor. The method of FIG. 5 may be applicable to a temperature sensing unit such as temperature sensing unit 300 of FIG. 3 or temperature sensing unit 400 of FIG. 4 as well as to a processor such as processor 100 in FIG. 1. Referring collectively to processor 100, temperature sensing unit 300 and the flowchart of FIG. 5, the method may begin in block 501.

First, second, and third voltage levels may be generated (block 502). The first voltage level may correspond to an output of $V_{REF}$ 301 and may have a first temperature slope, i.e., an amount of voltage level change per degree Celsius of temperature change. The second voltage level may correspond to an output of $V_{BE1}$ 302 and may have a second temperature slope while the third voltage level may correspond to an output of $V_{BE15}$ 303 and may have a third temperature slope. The second temperature slope may be the highest, followed by the third temperature slope, and then the first temperature slope may be the lowest. In some embodiments, the first temperature slope may be approximately zero, i.e., the voltage level doesn't change significantly in response to changes in junction temperature.

The first, second, and third voltage levels may be measured (block 503). Measurements of the first, second, and third voltage levels may be performed as described in relation to FIG. 3. That is, each voltage level may be selected, one at a time, and a time for a voltage ramp to rise above the selected voltage level may be measured as a count value of a counter, such as counter 320. Alternatively, the three voltage levels may be measured as described in regards to FIG. 4. In other words, each voltage level may have a corresponding comparator and counter for measuring the three voltages levels in parallel. Independent of the measurement method used, each count value may be sent to an arithmetic logic unit, such as ALU 330, to be used in the temperature calculation.

The junction temperature may be calculated dependent upon the three count values received by the arithmetic logic unit (block 504). The arithmetic logic unit, such as ALU 330 for example, may be designed to calculate, or in some embodiments, estimate, the junction temperature using the three count values received in block 503. ALU 330 may use an equation such as equation 14 described above. In some embodiments, the equation may include a constant value that may be device dependent. In other words, part-to-part variations during the manufacturing process may result in this constant value being different for each part (i.e., each processor 100). As such, a single calibration may be performed on each part during a factory test and values associated with the constant value may be stored in a non-volatile memory either within each processor 100 (e.g., in a fuse block, if available) or located external to processor 100 in a suitable form of non-volatile memory available within a system that includes processor 100. The calculated junction temperature may be sent to a corresponding power management unit, such as one of PMU 150a-d.

The method may depend on a value of the junction temperature (block 505). One of PMU 150 a-d may compare the junction temperature measurement to a threshold value. Processor 100 may be designed to operate at or below a given maximum junction temperature. If the junction temperature reaches the maximum value, then processor 100 may not perform reliably and in some embodiments, may be in danger of being physically damaged. To help prevent such an occurrence, a threshold value, lower than the maximum junction temperature value to provide a margin of safety, may be established such that if the junction temperature reaches the threshold value, a PMU 150 *a-d* may change the operating parameters of processor 100 that may reduce the junction temperature.

In some embodiments, a second threshold value may be included. A second threshold value may be established well below the maximum junction temperature value. If the junction temperature reaches the second threshold value, processor 100 may be operating at a low enough temperature that any changes previously made to the operating parameters to reduce the junction temperature may be reversed, which may improve a performance level of processor 100. If the junction temperature measurement is beyond a threshold value, then the method may move to block 506 to adjust the operating parameters. Otherwise, the method may end in block 507.

If the junction temperature measurement is beyond the threshold value, then operating parameters of processor 100 may be adjusted (block 506). In order to reduce the junction temperature, power consumption of processor 100 may need to be reduced to a level at which the power dissipation capacity of a package of processor 100 is greater than the power being turned to heat within processor 100. Since power is dependent on both voltage and frequency, either or both may be lowered in order to reduce power consumption. In some embodiments, each PMU 150*a-d* may include a plurality of supply voltage settings paired with a respective operating frequency setting.

Each PMU 150*a-d* may start with a first voltage-frequency setting that may maximize performance of the corresponding cores 101 in processor 100. Subsequent voltage-frequency settings may produce a lower power consumption than the previous setting, such that each time a given PMU 150*a-d* determines that the measured junction temperature has risen above the threshold value, the next voltage-frequency setting is selected. This may continue until a junction temperature measurement falls below the threshold value, at which point, the given PMU 150*a-d* may increase performance by selecting the previous voltage-frequency setting. In some embodiments, the measured junction temperature may be required to remain below the threshold value for a predetermined amount of time before switching back to a previous voltage-frequency setting. In other embodiments, a second threshold value, lower than the original threshold value, may be used instead of a predetermined amount of time. In such embodiments, a junction temperature measurement may need to be below the second threshold value before the given PMU 150*a-d* may select the previous voltage-frequency setting to improve performance. In an embodiment such as processor 100, each PMU 150*a-d* may control supply voltage and operating frequency settings for a corresponding group of cores 101. If each temperature sensing unit 140*a-d* measures a junction temperature associated with each group of cores 101, then power consumption and junction temperature may be controlled and monitored independently for each group of cores 101. The method may end in block 507.

The method of FIG. 5 is merely an example. Although the operations illustrated in method in FIG. 5 are depicted as being performed in a sequential fashion, in other embodiments, some or all of the operations may be performed in parallel or in a different sequence.

Numerous variations and modifications will become apparent to those skilled in the art once the above disclosure is fully appreciated. It is intended that the following claims be interpreted to embrace all such variations and modifications.

What is claimed is:

1. An apparatus, comprising:
    a first temperature sensitive circuit configured to generate a first voltage level that is based on a current operating temperature;
    a second temperature sensitive circuit configured to generate a second voltage level that is based on the current operating temperature, wherein the second temperature sensitive circuit has a temperature sensitivity that is different than a temperature sensitivity of the first temperature sensitive circuit;
    a reference voltage generator configured to generate a third voltage level, wherein the reference voltage generator is less sensitive to temperature changes than the first or second temperature sensitive circuits;
    circuitry configured to:
        measure the first voltage level, the second voltage level, and the third voltage level;
        calculate a difference between the first voltage level and the second voltage level; and
        determine a value indicative of the current operating temperature based on a ratio of the difference to the third voltage level.

2. The apparatus of claim 1, wherein to measure the first voltage level, the second voltage level, and the third voltage level, the circuitry is further configured to measure a time for a capacitor to charge to each of the first voltage level, the second voltage level, and the third voltage level, respectively.

3. The apparatus of claim 1, wherein to measure the first voltage level, the second voltage level, and the third voltage level, the circuitry is further configured to select, one at a time, each of the first voltage level, the second voltage level, and the third voltage level and measure the selected voltage level.

4. The apparatus of claim 1, wherein the first temperature sensitive circuit is further configured to change the first voltage level linearly with corresponding changes in the current operating temperature; and
    wherein the second temperature sensitive circuit is further configured to change the second voltage level linearly with the corresponding changes in the current operating temperature.

5. The apparatus of claim 1, wherein the circuitry is further configured to:
    calibrate the first and second temperature sensitive circuits at a single temperature; and
    determine calibration values in response to calibrating the first and second temperature sensitive circuits.

6. The apparatus of claim 5, wherein the temperature sensitivities of the first temperature sensitive circuit and the second temperature sensitive circuit change responsive to variations in a manufacturing process, and wherein the circuitry is further configured to compensate for the change in the temperature sensitivities by using the calibration values.

7. The apparatus of claim 5, wherein the circuitry is further configured to send the determined value to a power management unit.

8. A method for measuring an operating temperature of a semiconductor, comprising:
    generating a first voltage level based on a current operating temperature, wherein the first voltage level changes by a first amount in response to a given change in the operating temperature;
    generating a second voltage level based on the current operating temperature, wherein the second voltage level changes by a second amount, different than the first amount, in response to the given change in the current operating temperature;

generating a third voltage level, wherein the third voltage level changes by a third amount in response to the given change in the current operating temperature, wherein the third amount is less than the first amount and the second amount;

measuring the first voltage level, the second voltage level, and the third voltage level;

determining a difference between the first voltage level and the second voltage level; and determining a value indicative of the current operating temperature based on a ratio of the difference to the third voltage level.

9. The method of claim 8, wherein measuring the first voltage level, the second voltage level, and the third voltage level comprises measuring a time for a capacitor to charge to each of the first voltage level, the second voltage level, and the third voltage level, respectively.

10. The method of claim 8, wherein measuring the first voltage level, the second voltage level, and the third voltage level comprises selecting, one at a time, each of the first voltage level, the second voltage level, and the third voltage level and measuring the selected voltage level.

11. The method of claim 8, wherein the first voltage level changes linearly with corresponding changes in the current operating temperature, and wherein the second voltage level changes linearly with the corresponding changes in the current operating temperature.

12. The method of claim 8, further comprising:
calibrating the first voltage level and the second voltage level at a single temperature; and
determining calibration values in response to calibrating the first voltage level and the second voltage level.

13. The method of claim 12, wherein the first amount and the second amount change responsive to variations in a manufacturing process, and further comprising compensating for the change in the first amount and the second amount by using the calibration values.

14. The method of claim 8, further comprising determining a new operating frequency dependent upon the determined value.

15. A system, comprising:
at least one processor;
a clock source configured to:
generate a clock signal for use by the at least one processor; and
adjust a frequency of the clock signal dependent upon a received frequency value;

a temperature sensing unit configured to:
generate a first voltage level and a second voltage level, both based on a current operating temperature, wherein the first voltage level changes by a first amount and the second voltage level changes by a second amount, different than the first amount, in response to a given change in the current operating temperature;
generate a third voltage level;
measure the first voltage level, the second voltage level, and the third voltage level;
calculate a difference between the first voltage level and the second voltage level; and
determine a value indicative of the current operating temperature based on a ratio of the difference to the third voltage level; and a power management unit configured to send a new frequency value to the clock source responsive to a determination the current operating temperature has changed by a threshold value.

16. The system of claim 15, further comprising a voltage regulating unit configured to adjust a level of a power supply signal dependent upon a received power value, wherein the power management unit is configured to send a new power value to the voltage regulating unit responsive to the determination the current operating temperature has changed by the threshold value.

17. The system of claim 15, wherein to measure the first voltage level, the second voltage level, and the third voltage level, the temperature sensing unit is further configured to measure a time for a capacitor to charge to each of the first voltage level, the second voltage level, and the third voltage level, respectively.

18. The system of claim 15, wherein to measure the first voltage level, the second voltage level, and the third voltage level, the temperature sensing unit is further configured to select, one at a time, each of the first voltage level, the second voltage level, and the third voltage level and measure the selected voltage level.

19. The system of claim 15, wherein the temperature sensing unit is further configured to:
change the first voltage level linearly with corresponding changes in the current operating temperature; and
change the second voltage level linearly with the corresponding changes in the current operating temperature.

20. The system of claim 15, wherein the temperature sensing unit is further configured to:
calibrate the first voltage level and the second voltage level at a single temperature; and
determine calibration values in response to calibrating the first voltage level and the second voltage level.

* * * * *